US008289109B2

(12) United States Patent
Yu et al.

(10) Patent No.: US 8,289,109 B2
(45) Date of Patent: Oct. 16, 2012

(54) ELECTROMAGNETIC BANDGAP PATTERN STRUCTURE, METHOD OF MANUFACTURING THE SAME, AND SECURITY PRODUCT USING THE SAME

(75) Inventors: Jong Won Yu, Daejon (KR); Won Gyu Lim, Daejon (KR); Hyeong Seok Jang, Gyeongsangbuk-do (KR); Dong Hoon Shin, Daegu (KR); Jin Ho Ryu, Daejon (KR); Hyun Mi Kim, Daejon (KR); Won Gyun Choe, Daejon (KR)

(73) Assignee: Korea Minting, Security Printing & ID Card Operating Corp., Daejeon (KR)

( * ) Notice: Subject to any disclaimer, the term of this patent is extended or adjusted under 35 U.S.C. 154(b) by 349 days.

(21) Appl. No.: 12/784,356

(22) Filed: May 20, 2010

(65) Prior Publication Data

US 2010/0295633 A1 Nov. 25, 2010

(30) Foreign Application Priority Data

May 22, 2009 (KR) ........................ 10-2009-0045159

(51) Int. Cl.
*H01P 1/203* (2006.01)
*G03F 7/20* (2006.01)

(52) U.S. Cl. .................................... 333/204; 340/572.1

(58) Field of Classification Search .................. 333/204, 333/205; 340/572.1, 572.7, 572.5
See application file for complete search history.

(56) References Cited

U.S. PATENT DOCUMENTS

| | | | | |
|---|---|---|---|---|
| 7,102,469 | B2 * | 9/2006 | Kim et al. | 333/204 |
| 7,626,216 | B2 * | 12/2009 | McKinzie, III | 257/192 |
| 8,158,889 | B2 * | 4/2012 | Kim et al. | 174/261 |
| 2008/0204127 | A1 | 8/2008 | Choi | |

FOREIGN PATENT DOCUMENTS

| | | | |
|---|---|---|---|
| JP | 06-244583 | A | 9/1994 |
| JP | 09-199931 | A | 7/1997 |
| JP | 2000-269724 | A | 9/2000 |
| JP | 2005-244043 | A | 9/2005 |
| KR | 10-0838246 | B1 | 6/2008 |

* cited by examiner

*Primary Examiner* — Stephen Jones
(74) *Attorney, Agent, or Firm* — Rabin & Berdo. P.C.

(57) ABSTRACT

An electromagnetic bandgap (EBG) pattern structure includes a nonconductive substrate and a pattern assembly formed on the substrate. The EBG pattern structure also includes regularly arranged closed-loop patterns and open-loop patterns, both of which are made of a conductive material. The EBG pattern structure can be used to manufacture new security products by applying its frequency characteristics to securities or IDs and variously used in security technologies for preventing forgery and alteration because various security codes can be created by adjusting the variables of its EBG pattern.

17 Claims, 13 Drawing Sheets

(a) (b)

ELECTROMAGNETIC BANDGAP PATTERN STRUCTURE, METHOD OF MANUFACTURING THE SAME, AND SECURITY PRODUCT USING THE SAME

CROSS-REFERENCE TO RELATED APPLICATION

The present application claims priority under 35 USC §119 to Korean Patent Application No. 10-2009-0045159, filed May 22, 2009.

BACKGROUND OF THE INVENTION

1. Field of the Invention

The present invention relates to an electromagnetic bandgap (EBG) pattern structure, a method of manufacturing the same, and a security product using the same.

2. Description of the Related Art

Generally, a microwave bandgap (MBG) structure or an EBG structure is realized on a microstrip, and is used to improve the performance of antennas, improve the power efficiency of amplifiers, realize the high Q of resonators, prevent the harmonic components of resonators, design new-type duplexers, and the like. The EBG structure, which is applied to a microstrip circuit, is manufactured by perforating a dielectric substrate, etching its grounded surface to have repeated shapes, deforming microstrip lines or the like.

SUMMARY OF THE INVENTION

Accordingly, an object of the present invention is to provide an EBG pattern structure which can create various security codes, and a method of manufacturing the same.

One embodiment of the present invention provides an EBG pattern structure, comprising: a nonconductive substrate; and a pattern assembly formed on the nonconductive substrate, wherein the pattern assembly comprises regularly arranged closed-loop patterns and open-loop patterns, both of which are made of a conductive material.

Here, the pattern assembly can further comprise bar patterns which are made of conductive material and are regularly arranged in combination with the closed-loop patterns or the open-loop patterns.

Further, the conductive material can include at least one element selected from Au, Al, Ag, Cu, Ni and Fe.

Further, the substrate can be formed of at least any one selected from paper, a polyvinylchloride (PVC) sheet, a polycarbonate (PC) sheet, a polyethyleneterephthalate (PET) sheet, a glycol-modified polyethyleneterephthalate (PETG) sheet, a sheet made of a mixture of a polyvinylchloride (PVC) resin and an acrylonitrile butadiene styrene (ABS) resin, a sheet made of a mixture of a polycarbonate (PC) resin and a glycol-modified polyethyleneterephthalate (PETG) resin, polyester synthetic paper, and a metal thin film.

Further, the pattern assembly can be resonated in a predetermined frequency band, and a value of the predetermined frequency band can be changed depending on the permittivity of the substrate, line width and length of the closed-loop patterns and the open-loop patterns, intervals between the closed-loop patterns and the open-loop patterns, or gap size of the open-loop patterns.

Further, each of the closed-loop patterns and the open-loop patterns can have a quadrangular shape, each of the open-loop patterns can have a gap formed in any one direction of four directions, and the pattern assembly can be resonated in a predetermined frequency band and has one or more resonance frequency bands depending on the direction of the gap formed in each of the quadrangular open-loop patterns.

Further, the pattern assembly can be resonated in a predetermined frequency band, and a value of the predetermined frequency band can be changed depending on the permittivity of the substrate, line width and length of the closed-loop patterns and the open-loop patterns, intervals between the closed-loop patterns and the open-loop patterns, gap size of the open-loop patterns or length of the bar patterns.

Another embodiment of the present invention provides a method of manufacturing an EBG pattern structure, comprising: attaching a photosensitive film on a substrate coated with a conductive material layer and then attaching a negative photosensitive film provided with an EBG pattern on the photosensitive film; exposing the photosensitive film attached with the negative photosensitive film; developing the exposed photosensitive film to form the EBG pattern thereon; and partially etching the conductive material layer formed on the substrate to form the EBG pattern made of the conductive material on the substrate.

Here, the conductive material layer can be a thin film made of at least one element selected from Au, Al, Ag, Cu, Ni and Fe.

Further, the substrate can be formed of at least any one element selected from paper, a polyvinylchloride (PVC) sheet, a polycarbonate (PC) sheet, a polyethyleneterephthalate (PET) sheet, a glycol-modified polyethyleneterephthalate (PETG) sheet, a sheet made of a mixture of a polyvinylchloride (PVC) resin and an acrylonitrile butadiene styrene (ABS) resin, a sheet made of a mixture of a polycarbonate (PC) resin and a glycol-modified polyethyleneterephthalate (PETG) resin, and polyester synthetic paper.

Another embodiment of the present invention provides a method of manufacturing an EBG pattern structure, comprising: fabricating a mask provided with an EBG pattern using a screen plate; adhering the mask onto a substrate and then applying a conductive material on the substrate through the mask; and baking the substrate coated with the conductive material to form the EBG pattern made of the conductive material on the substrate.

Here, the conductive material can be conductive ink containing at least one element selected from Au, Al, Ag, Cu, Ni and Fe.

Further, the substrate can be formed of at least any one selected from paper, a polyvinylchloride (PVC) sheet, a polycarbonate (PC) sheet, a polyethyleneterephthalate (PET) sheet, a glycol-modified polyethyleneterephthalate (PETG) sheet, a sheet made of a mixture of a polyvinylchloride (PVC) resin and an acrylonitrile butadiene styrene (ABS) resin, a sheet made of a mixture of a polycarbonate (PC) resin and a glycol-modified polyethyleneterephthalate (PETG) resin, and polyester synthetic paper.

Another embodiment of the present invention provides a method of manufacturing an EBG pattern structure, comprising: forming an EBG pattern made of a conductive material on a substrate using ink-jet printing; and baking the EBG pattern formed on the substrate.

Here, the conductive material can be conductive ink containing at least one element selected from Au, Al, Ag, Cu, Ni and Fe.

Further, the substrate can be formed of at least any one selected from paper, a polyvinylchloride (PVC) sheet, a polycarbonate (PC) sheet, a polyethyleneterephthalate (PET) sheet, a glycol-modified polyethyleneterephthalate (PETG) sheet, a sheet made of a mixture of a polyvinylchloride (PVC) resin and an acrylonitrile butadiene styrene (ABS) resin, a sheet made of a mixture of a polycarbonate (PC) resin and a glycol-modified polyethyleneterephthalate (PETG) resin, and polyester synthetic paper.

Still another embodiment of the present invention provides a security product for inquiring ID and preventing forgery, using the above electromagnetic bandgap pattern structure.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, exemplary embodiments of the present invention will be described in detail with reference to the attached drawings.

Figure 1:
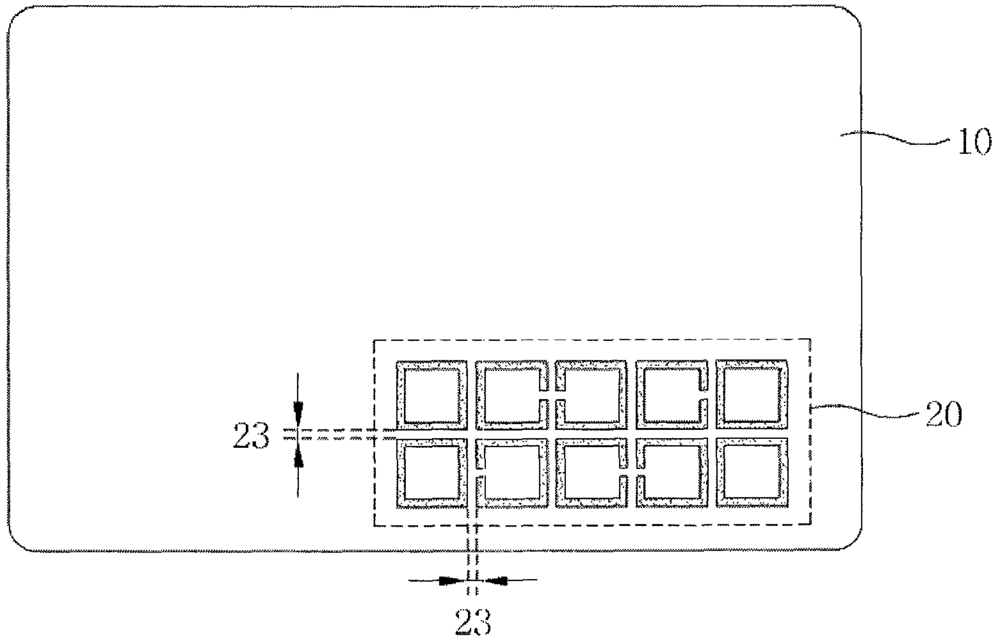
FIG. 1 is a view showing an EBG pattern structure according to an embodiment of the present invention.

FIG. 1 is a view showing an EBG pattern structure according to an embodiment of the present invention.

Referring to FIG. 1, the EBG pattern structure according to this embodiment includes a substrate 10 and a pattern assembly 20.

The substrate 10 can be a nonconductor, preferably a dielectric substrate having a permittivity ($\in_r$) of 2-5. Further, the substrate 10 can be formed of any one selected from paper, a polyvinylchloride (PVC) sheet, a polycarbonate (PC) sheet, a polyethyleneterephthalate (PET) sheet, a glycol-modified polyethyleneterephthalate (PETG) sheet, a sheet made of a mixture of a polyvinylchloride (PVC) resin and an acrylonitrile butadiene styrene (ABS) resin, a sheet made of a mixture of a polycarbonate (PC) resin and a glycol-modified polyethyleneterephthalate (PETG) resin, polyester synthetic paper, and a metal thin film.

Figure 2A:
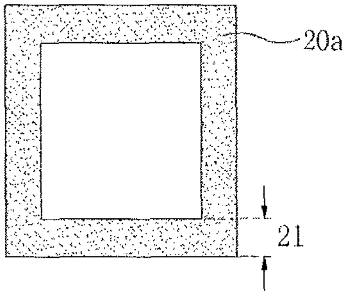
FIGS. 2A, 2B and 2C are views showing a closed-loop pattern, an open-loop pattern and a bar pattern, respectively, according to an embodiment of the present invention.
Figure 2B:
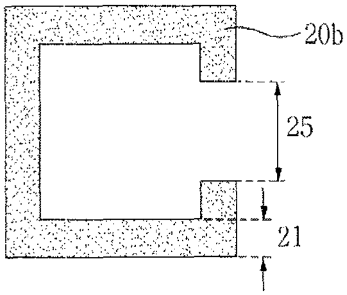

The pattern assembly 20 is formed on the substrate 10, and includes closed-loop patterns and open-loop patterns both of which are made of a conductive material. That is, as seen in FIGS. 2A and 2B, the pattern assembly 20 includes closed-loop patterns 20*a*, each of which does not have a gap which is a line-cut portion, and open-loop patterns 20*b*, each of which has the gap. These closed-loop patterns 20*a* and open-loop patterns 20*b* are regularly arranged. Here, closed-loop patterns 20*a* and open-loop patterns 20*b* may have various shapes, such as a circle, a quadrangle, a polygon and the like.

Figure 2C:
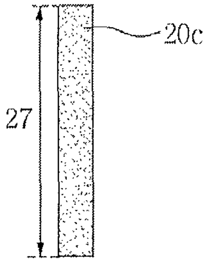

Meanwhile, as seen in FIG. 2C, the substrate can further include bar patterns 20*c* made of a conductive material thereon. The bar patterns 20*c* can be regularly arranged in combination with the closed-loop patterns 20*a* or the open-loop patterns 20*b* of FIGS. 2A and 2B.

The conductive material used to form the closed-loop patterns 20*a*, open-loop patterns 20*b* and bar patterns 20*c* can include a metal component, such elements as Au, Al, Ag, Cu, Ni, Fe, or the like. Finally, the EBG pattern structure including the substrate 10 and the pattern assembly 20 can be fabricated in the form of a card with an upper surface provided with a printing layer and with a lower surface provided with a protective layer.

The EBG pattern structure according to an embodiment of the present invention includes the closed-loop patterns 20*a* and open-loop patterns 20*b*, which are capacitively loaded patterns, as a unit cell. These closed-loop patterns 20*a* and open-loop patterns 20*b* are regularly arranged on the substrate 10. The EBG pattern structure approximates an LC resonance circuit, and exhibits reflection and transmission characteristics at a predetermined frequency band by resonance. The EBG pattern structure can be used to create a security code using the reflection and transmission characteristics thereof.

At the time of resonation of the pattern assembly 20, as represented by Mathematical Equation 1 below, the resonance frequency value thereof can be determined by equivalent inductance (L) and equivalent capacitance (C).

$$f_0 = \frac{1}{2\pi\sqrt{LC}} \quad \text{[Mathematical Equation 1]}$$

In resonance frequency ($f_0$), variables changing the values of equivalent inductance (L) and equivalent capacitance (C) can include permittivity ($\in_r$) of the substrate 10, width 21 and length of the line constituting the closed-loop pattern 20*a* or the open-loop pattern 20*b*, intervals 23 between loop patterns, gap size 25 of the open-loop pattern 20*b*, length 27 of the bar pattern 20*c*, and the like.

In the embodiment of the present invention, the change of resonance frequency value was observed while changing the respective variables.

FIGS. 3A to 9 are views and graphs showing the frequency characteristics of a security product according to an embodiment of the present invention.

In the graphs shown in FIGS. 3A to 9, the X-axis has a frequency range of 8-12 GHz, and S11 and S21 of the Y-axis are log scale values of output to input, respectively. Here, as S11 and S21 approximate to 0, shielding efficiencies become low, and as the absolute values of S11 and S21 are increased, shielding efficiencies become high.

Figure 3A:
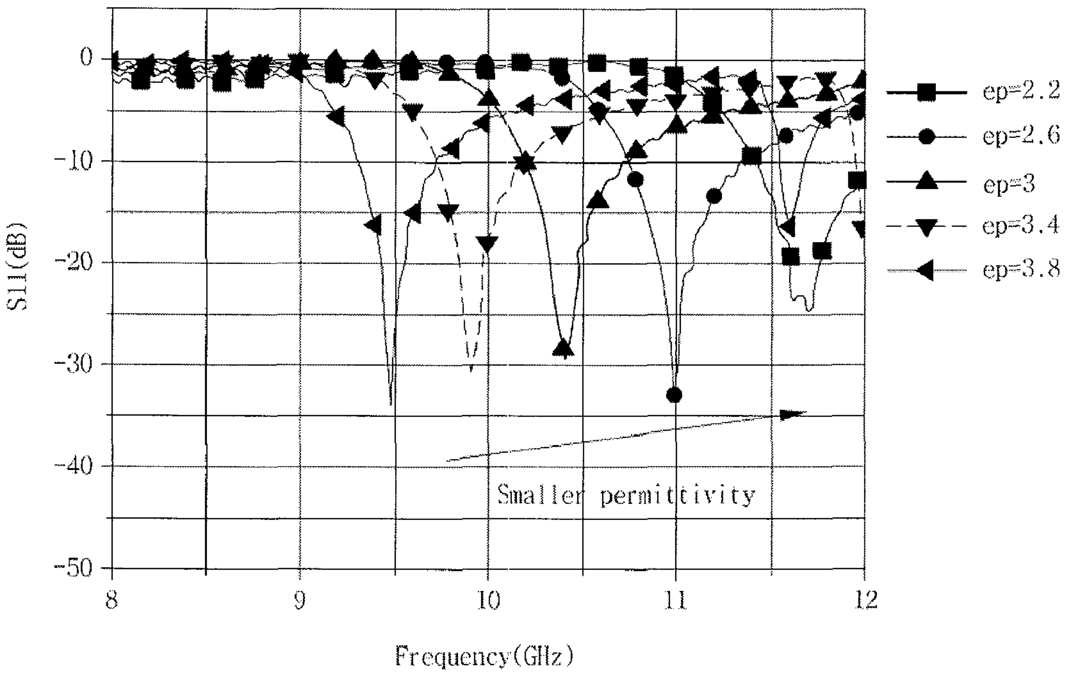
FIG. 3A is a graph showing the change of resonance frequency value depending on the change in permittivity of a substrate in frequency reflection characteristics.
Figure 3B:
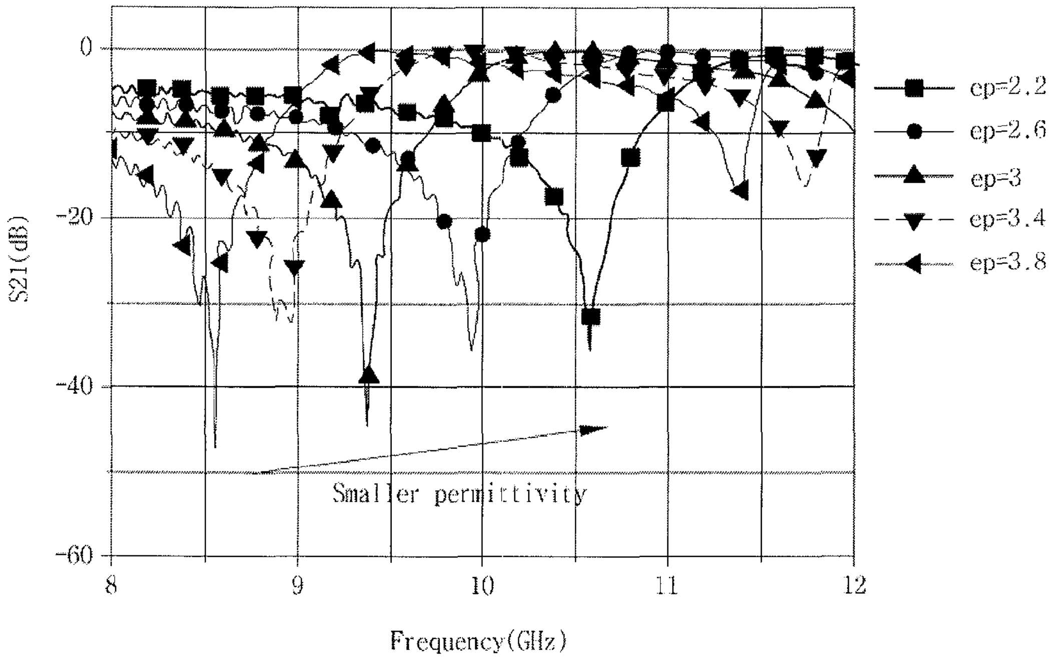
FIG. 3B is a graph showing the change of resonance frequency value depending on the change in permittivity of a substrate in frequency transmission characteristics.

FIG. 3A is a graph showing the change of resonance frequency value depending on the change in permittivity ($\in_r$) of a substrate in the frequency reflection characteristics of the security product, and FIG. 3B is a graph showing the change of resonance frequency value depending on the change in permittivity ($\in_r$) of a substrate in the frequency transmission characteristics of the security product.

As shown in FIGS. 3A and 3B, the change of resonance frequency value was observed while decreasing the permittivity (ep) of a substrate from 3.8 to 2.2. As a result, it can be seen that the values of equivalent inductance (L) and equivalent capacitance (C) are decreased as the permittivity (ep) of the substrate is decreased, and thus the resonance frequency value ($f_0$) is increased.

Figure 4A:
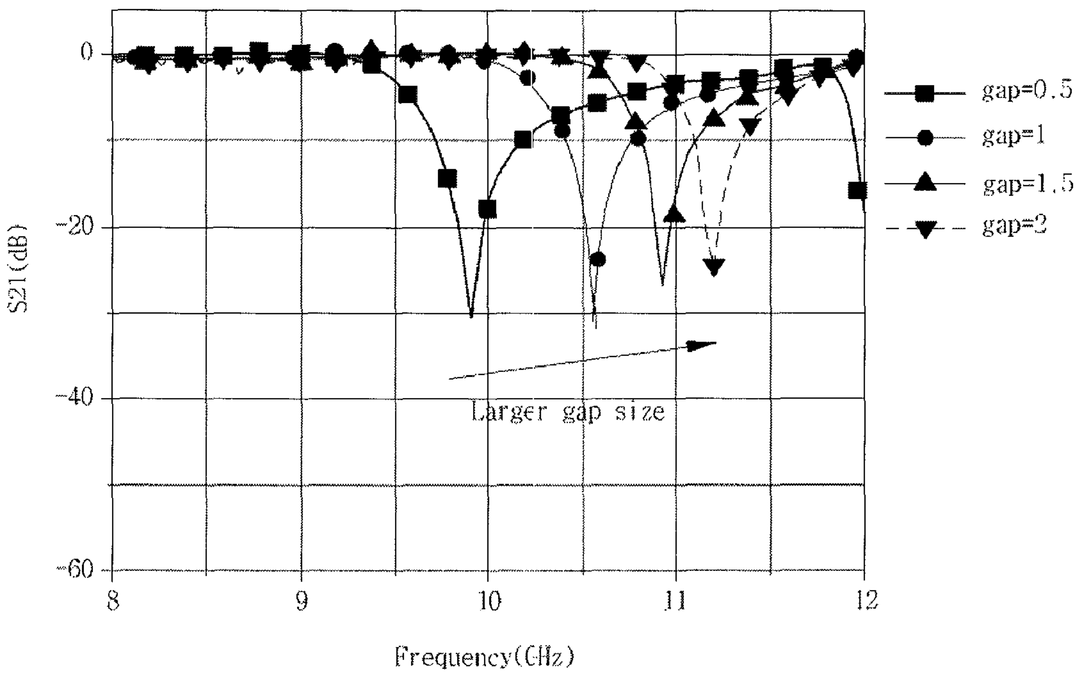
FIG. 4A is a graph showing the change of resonance frequency value depending on the change of gap size in frequency reflection characteristics.
Figure 4B:
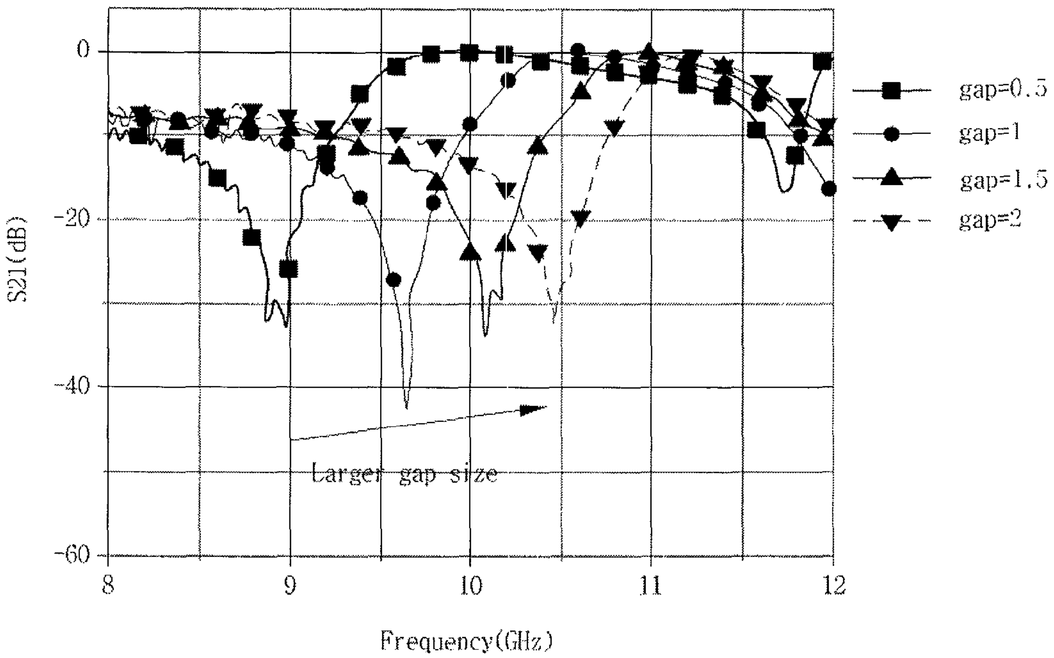
FIG. 4B is a graph showing the change of resonance frequency value depending on the change of gap size in frequency transmission characteristics.

FIG. 4A is a graph showing the change of resonance frequency value depending on the change of gap size 25 in the frequency reflection characteristics of the security product, and FIG. 4B is a graph showing the change of resonance frequency value depending on the change of gap size 25 in the frequency transmission characteristics of the security product.

As shown in FIGS. 4A and 4B, the change of resonance frequency value was observed while increasing the gap size 25 from 0.5 to 2 mm. As a result, it can be seen that the value of equivalent capacitance (C) is decreased as the gap size 25 is increased, and thus the resonance frequency value ($f_0$) is increased.

Figure 5A:
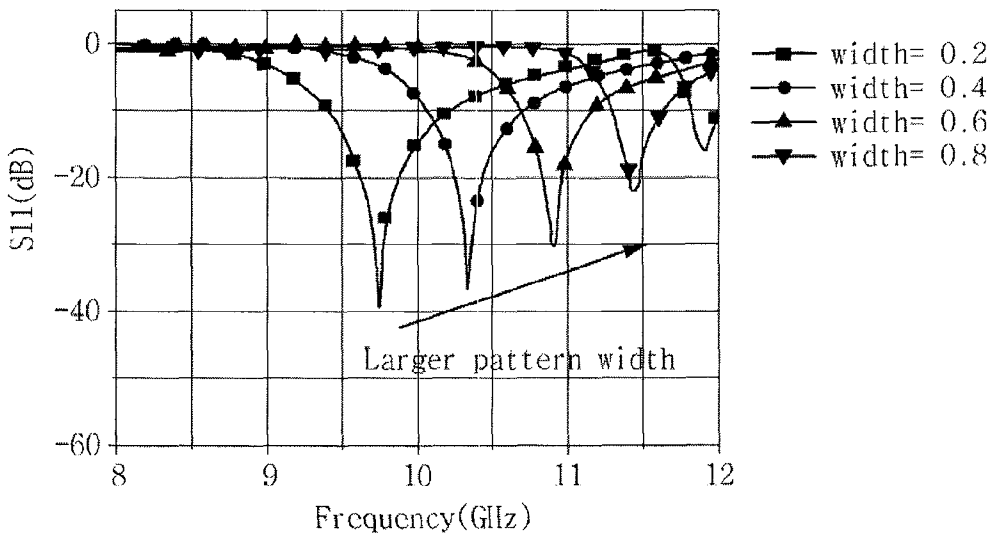
FIG. 5A is a graph showing the change of resonance frequency value depending on the change of pattern width in frequency reflection characteristics.
Figure 5B:
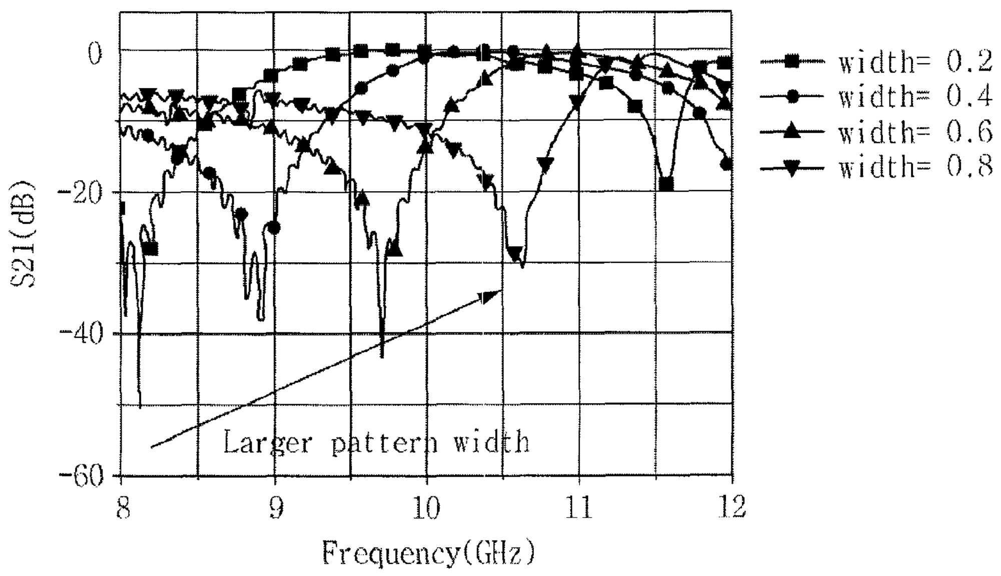
FIG. 5B is a graph showing the change of resonance frequency value depending on the change of pattern width in frequency transmission characteristics.

FIG. 5A is a graph showing the change of resonance frequency value depending on the change of pattern width 21 in the frequency reflection characteristics of the security product, and FIG. 5B is a graph showing the change of resonance frequency value depending on the change of pattern width 21 in the frequency transmission characteristics of the security product.

As shown in FIGS. 5A and 5B, the change of resonance frequency value was observed while increasing the pattern width 21 from 0.2 to 0.8 mm. As a result, it can be seen that the value of equivalent inductance (L) is decreased as the pattern width 21 is increased, and thus the resonance frequency value ($f_0$) is increased.

Figure 6A:
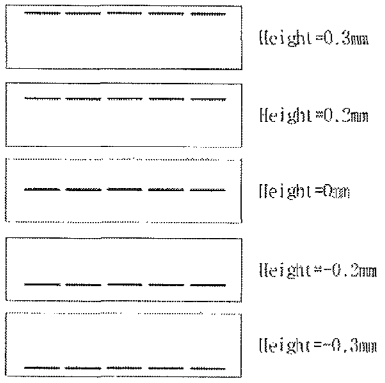
FIG. 6A is a view of various positions of a pattern.
Figure 6B:
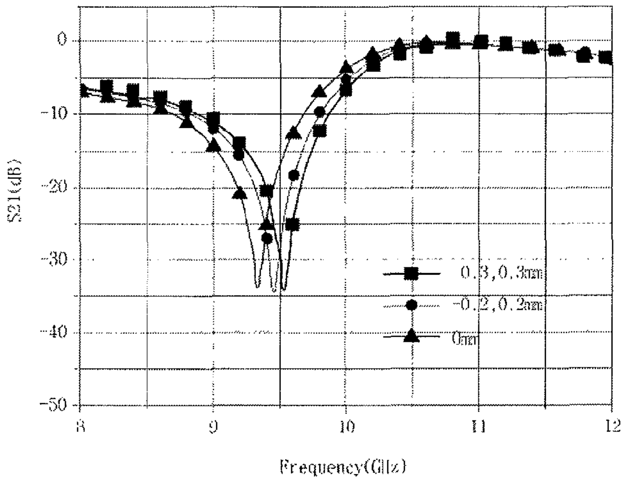
FIG. 6B is a graph showing the change of frequency transmission characteristics depending on the position of the pattern.

Further, the frequency transmission characteristics of the security product can be changed depending on the positions of a layer on which patterns are formed. For example, as shown in FIGS. 6A and 6B, it can be seen that the effective permittivity of a core layer composed of EBG patterns is decreased as the core layer becomes more distant from the center (height=0 mm) of the security product, so the values of equivalent inductance (L) and equivalent capacitance (C) are decreased, thereby increasing the resonance frequency value ($f_0$).

In addition, in order to change the resonance frequency value ($f_0$), a part of the pattern can be made of a nonconductive material.

Figure 7A:
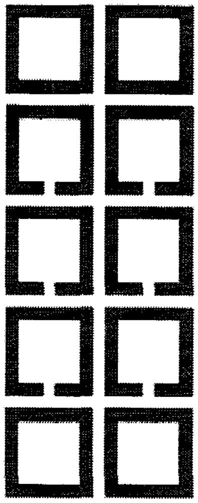
FIG. 7A is a view showing a pattern in which a resonance frequency appears once and FIG. 7B is a graph showing its frequency characteristics.
Figure 9A:
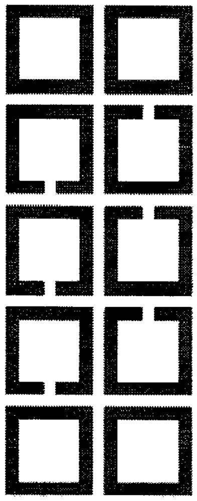
FIG. 9A is a view showing a pattern in which a resonance frequency appears three times and FIG. 9B is a graph showing its frequency characteristics.
Figure 9B:
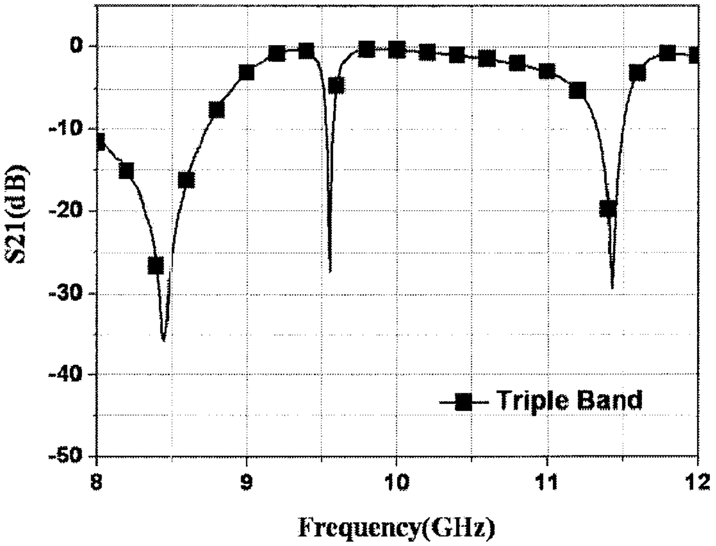

FIGS. 7A and 9B are views and graphs showing various frequency characteristics depending on the direction of the gaps of open-loop patterns.

Figure 7B:
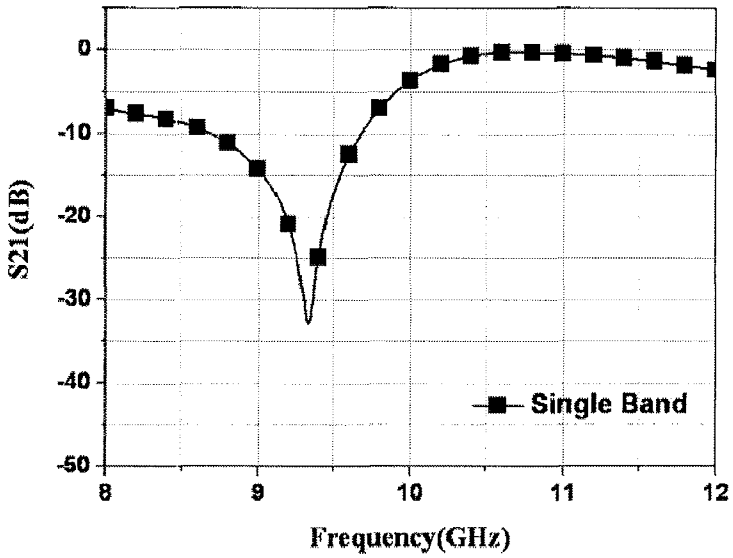
Figure 8A:
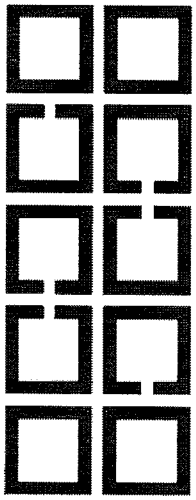
FIG. 8A is a view showing a pattern in which a resonance frequency appears twice and FIG. 8B is a graph showing its frequency characteristics.
Figure 8B:
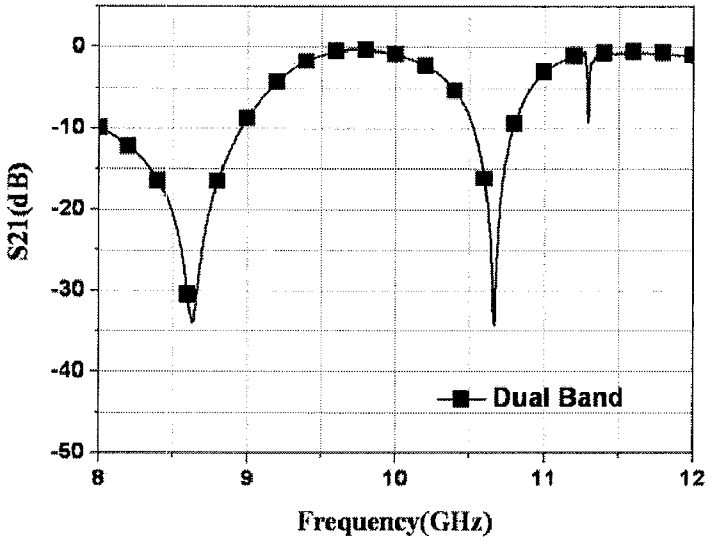

In the embodiments of the present invention, the EBG pattern structure includes square loop patterns, and the frequency characteristics of the EBG pattern structure are observed while changing the directions of the gaps of the open-loop patterns 20*b*. In experiments, since the EBG pattern structure is composed of square patterns, the gaps of the open-loop patterns 20*b* are formed in any one direction of upper, lower, left and right directions. As a result, depending on the directions of the gaps, the EBG pattern shows a 'Single Band' characteristic in which its resonance frequency appears once as shown in FIG. 7B, a 'Dual Band' characteristic in which its resonance frequency appears twice as shown in FIG. 8B, and a 'Triple Band' characteristic in which its resonance frequency appears three times as shown in FIG. 9B.

Therefore, the EBG pattern structure according to an embodiment of the present invention can obtain various resonance frequency values by adjusting such variables as permittivity ($\in_r$) of a substrate, size of gap, width of pattern, position of pattern, and the like, and can obtain various band characteristics depending on the direction of the gap.

Figure 10:
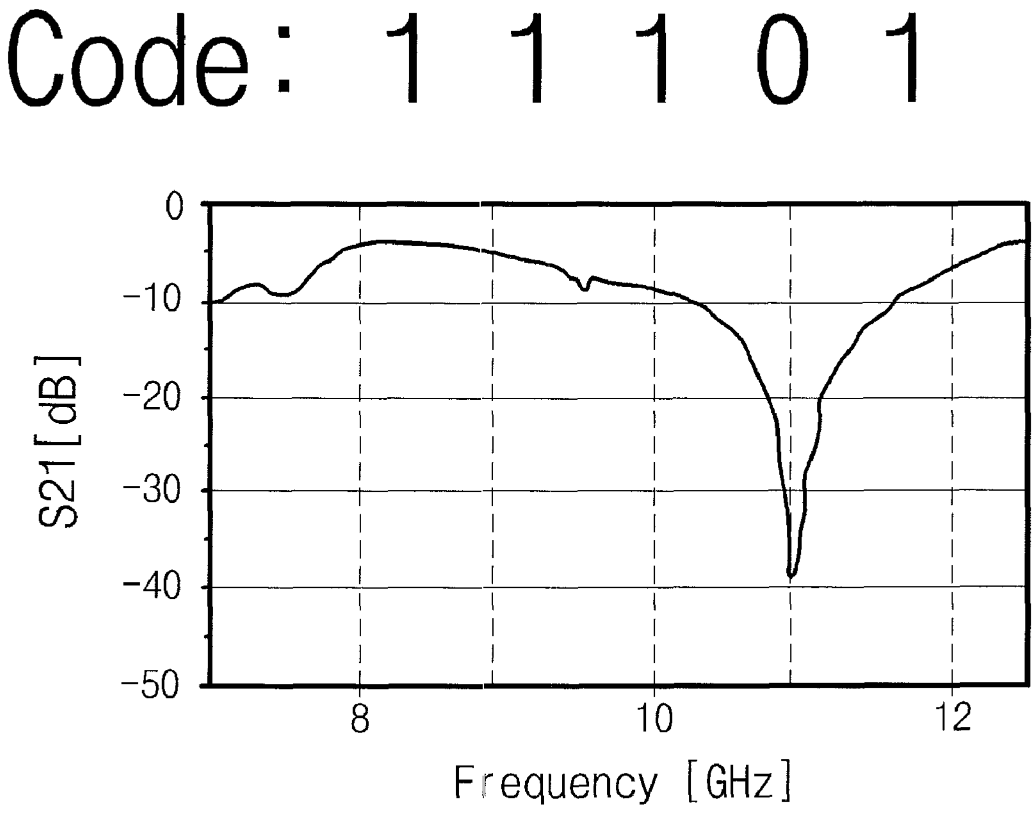
FIG. 10 is a view showing a method of creating a security code using the EBG pattern structure.

These frequency characteristics of the EBG pattern structure can be used to create various EBG security codes. That is, when the output values of the EBG pattern structure in a predetermined frequency band are analyzed, the occurrence of resonance is indicated by '0', and the nonoccurrence of resonance is indicated by '1', thereby creating the EBG security codes. For example, in the case where the EBG pattern structure according to the present invention exhibits frequency blocking characteristics as shown in FIG. 10, when the output values thereof are analyzed at a frequency of 8 GHz, 9 GHz, 10 GHz, 11 GHz and 12 GHz. Since resonance occurs only at a frequency of 11 GHz, this frequency is indicated by a code value of '0', and other frequencies are indicated by a code value of '1'. Therefore, the security code '11101' can be realized using the results of analysis of frequencies shown in FIG. 10.

The EBG pattern structure including the substrate 10 and the pattern assembly 20 can be used to manufacture security products for inquiring about identification (ID) and preventing forgery. Examples of the security products may include securities, ID cards and security cards embedded with the EBG pattern structure.

Hereinafter, methods of manufacturing an EBG pattern structure according to a preferred embodiment of the present invention will be described in detail with reference to the accompanying drawings.

FIGS. 11 to 14 are views showing methods of manufacturing an EBG pattern structure according to preferred embodiments of the present invention.

The methods of manufacturing an EBG pattern structure according to preferred embodiments of the present invention are performed using etching, screen printing and ink-jet printing.

1-1) A Method of Manufacturing an EBG Pattern Structure Using Etching

A photosensitive film is attached on a substrate 10 coated with a conductive material layer, and a negative photosensitive film provided with an EBG pattern is attached on the photosensitive film. Here, the EBG pattern can be the pattern assembly 20, shown in FIG. 1, including closed-loop patterns 20*a* and open-loop patterns 20*b* regularly arranged in FIGS. 2A and 2B. This EBG pattern can further include bar patterns 20*c* in FIG. 2C. The conductive material layer applied on the substrate 10 can be a thin film made of at least one element selected from Au, Al, Ag, Cu, Ni and Fe. The substrate 10 can be formed of any one selected from paper, a polyvinylchloride (PVC) sheet, a polycarbonate (PC) sheet, a polyethyleneterephthalate (PET) sheet, a glycol-modified polyethyleneterephthalate (PETG) sheet, a sheet made of a mixture of a polyvinylchloride (PVC) resin and an acrylonitrile butadiene styrene (ABS) resin, a sheet made of a mixture of a polycarbonate (PC) resin and a glycol-modified polyethyleneterephthalate (PETG) resin, and polyester synthetic paper.

Subsequently, the substrate 10 attached with the photosensitive film is exposed and developed to form desired patterns on the substrate 10. The conductive material layer which is not masked by the photosensitive film is partially etched. Thereafter, the unnecessary photosensitive film is removed from the substrate 10, thereby forming an EBG pattern made of a conductive material on the substrate 10.

1-2) Experimental Example 1

Figure 11:
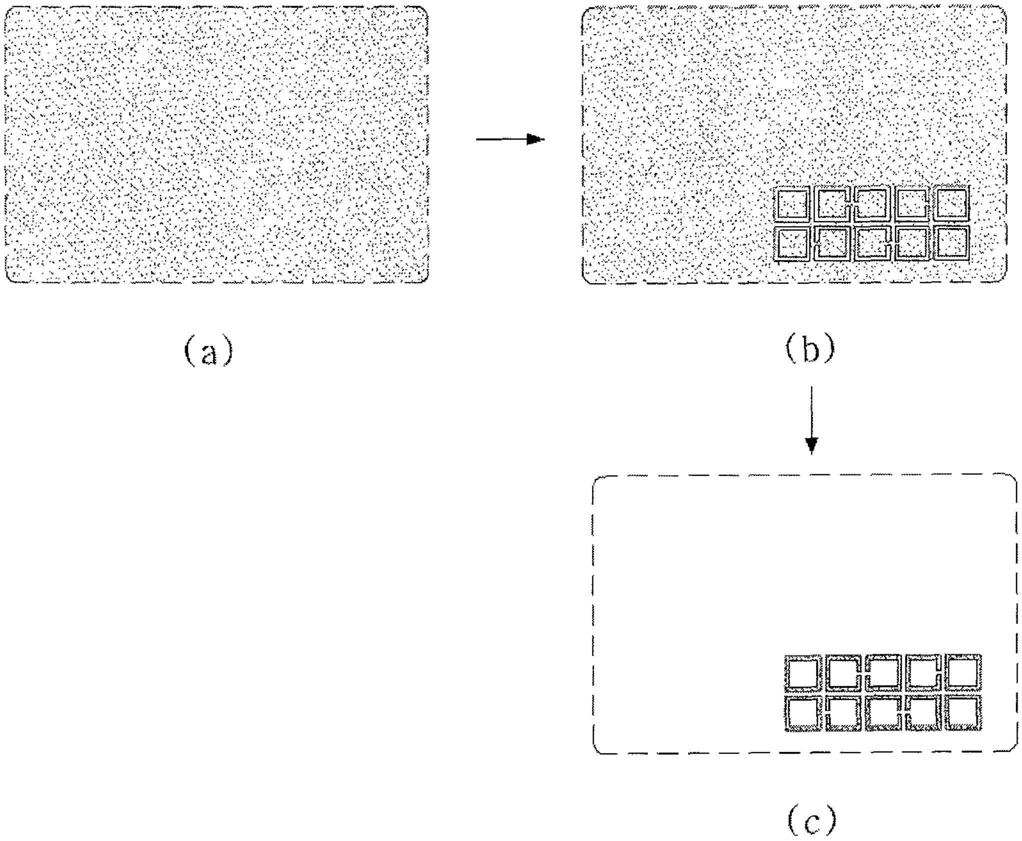
FIGS. 11 to 14 are views showing methods of manufacturing an EBG pattern structure according to exemplary embodiments of the present invention.

In order to evaluate the transmission and reflection characteristics of the EBG pattern to a specific frequency, as shown in FIG. 11, a sample security product was fabricated using a TACONIC RF 35 substrate coated with copper foil having a permittivity of 3.5.

First, as shown in (a) of FIG. 11, a TACONIC RF 35 substrate coated with copper foil having a permittivity of 3.5 was provided. Then, as shown in (b) of FIG. 11, a photosensitive film (HS930, manufactured by Hitachi Chemical Co., Ltd.) was attached on the substrate, and then a negative photosensitive film provided with an EBG pattern was attached on the photosensitive film. Loop patterns constituting the EBG pattern were formed into square patterns. Each of the square patterns had a side of 3.55 mm, a gap of 0.7 mm and a width of 0.7 mm, and the interval between the square patterns was 0.5 mm.

Subsequently, the photosensitive film attached with the negative photosensitive film was exposed by a Xenon lamp (6 KW) for 50-120 seconds, and was then developed and etched, thereby forming an EBG pattern made of copper (Cu) on the substrate, as shown in (c) of FIG. 11.

The frequency characteristics of the EBG pattern formed in this way were evaluated. As a result, it was found that the EBG pattern blocked a frequency of 9.52-11.46 GHz in a frequency band of 8-12 GHz.

1-3) Experimental Example 2

Figure 12:
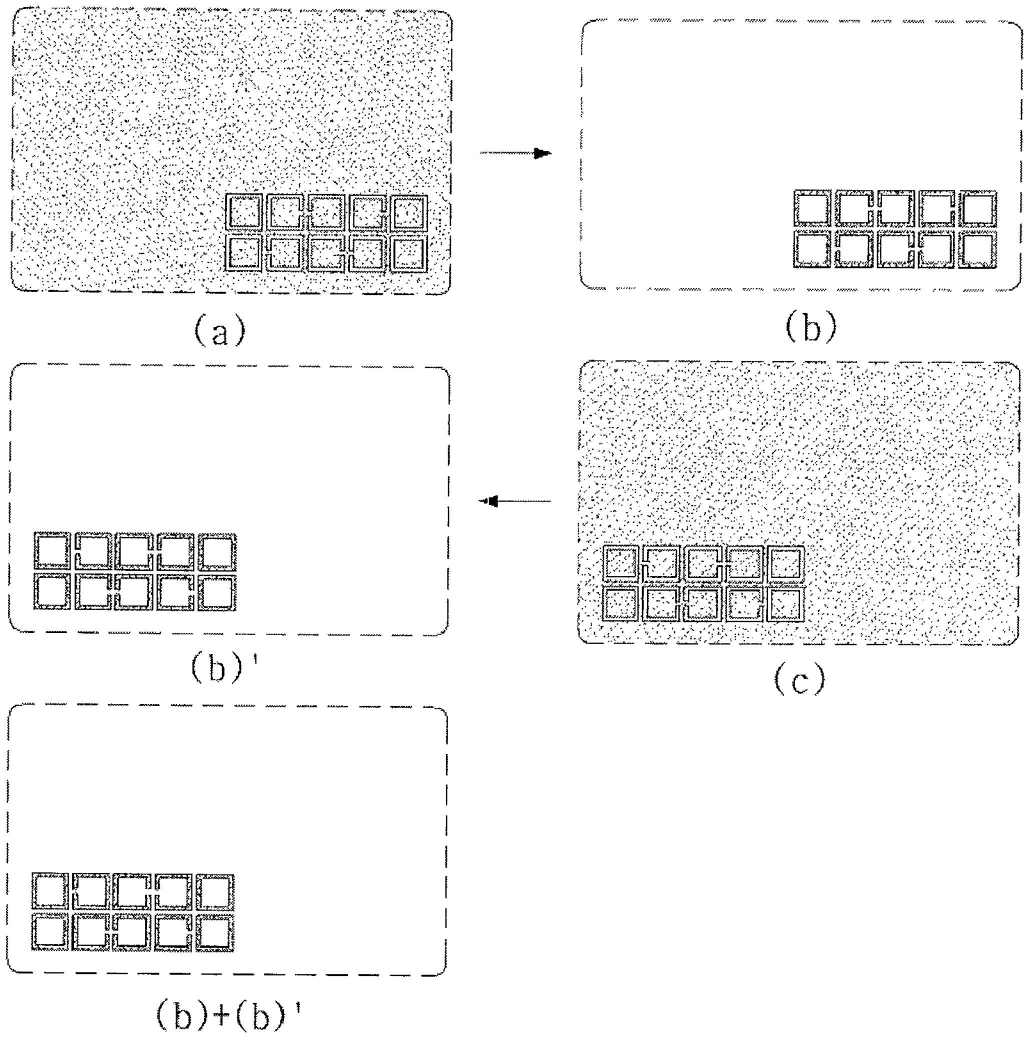
Figure 13:
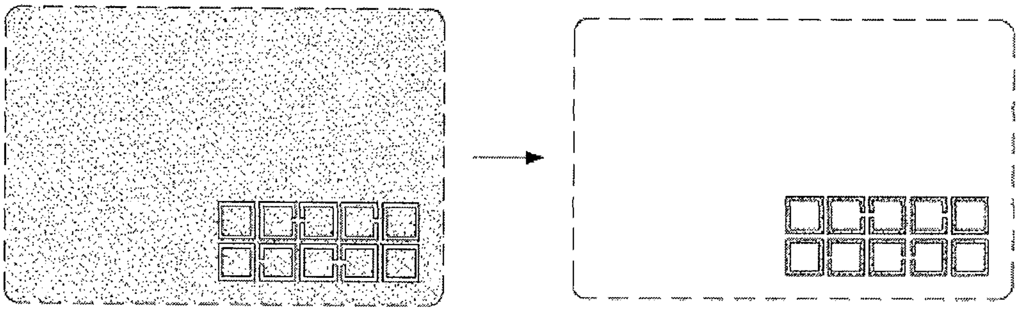

As shown in (b)+(b)' of FIG. 12, EBG patterns were formed on both sides of the TACONIC RF 35 substrate in the same manner as in Experimental Example 1. The frequency characteristics of the EBG patterns formed in this way were evaluated. As a result, it was found that the EBG patterns blocked a frequency of 9.28-10.4 GHz in a frequency band of 8-12 GHz.

2-1) A Method of Manufacturing an EBG Pattern Structure Using Screen Printing

First, a mask provided with an EBG pattern is fabricated using a screen plate.

Subsequently, the mask adheres closely onto a substrate, and then a conductive material is applied on the substrate through the mask. Here, the conductive material can be conductive ink containing at least one element selected from Au, Al, Ag, Cu, Ni and Fe. Further, the substrate can be formed of any one selected from paper, a polyvinylchloride (PVC) sheet, a polycarbonate (PC) sheet, a polyethyleneterephthalate (PET) sheet, a glycol-modified polyethyleneterephthalate (PETG) sheet, a sheet made of a mixture of a polyvinylchloride (PVC) resin and an acrylonitrile butadiene styrene (ABS) resin, a sheet made of a mixture of a polycarbonate (PC) resin and a glycol-modified polyethyleneterephthalate (PETG) resin, and polyester synthetic paper.

Finally, the substrate coated with the conductive material is baked by UV or hot air, thus repeatedly forming a plurality of EBG patterns on the substrate.

2-2) Experimental Example 1

First, a mask provided with an EBG pattern was fabricated using a screen plate. A method of fabricating the mask is described as follows. First, a photosensitive solution was applied on a screen plate (300 mesh) and sufficiently dried, and then a positive film provided with an EBG pattern was attached to the dried screen plate coated with the photosensitive solution. In this case, loop patterns constituting the EBG pattern were formed into square patterns. Each of the square patterns had a side of 3.55 mm, a gap of 0.5 mm and a width of 0.5 mm, and the interval between the square patterns was 0.5 mm. Subsequently, the screen plate attached with the positive film was exposed by a Xenon lamp (6 KW) for 180-200 seconds, and was then washed by spraying water, thereby fabricating a mask provided with an EBG pattern, as shown in (a) of FIG. 13.

Thereafter, the mask provided with the EBG pattern was disposed on a polycarbonate (PC) sheet having a permittivity of 3.3266, and then conductive ink was applied on the PC sheet, thereby printing the EBG pattern on the PC sheet. Subsequently, the conductive ink applied on the PC sheet was baked at a temperature of 130-150° C. for 20 minutes, thus forming the EBG pattern shown in (b) of FIG. 13.

The frequency characteristics of the EBG pattern formed in this way were evaluated. As a result, it was found that the EBG pattern blocked a frequency of 8-11.4 GHz in a frequency band of 8-12 GHz.

3-1) A Method of Manufacturing an EBG Pattern Structure Using Ink-Jet Printing

In this method, an EBG pattern is formed by printing the EBG pattern on a substrate using an ink-jet printer and then baking the printed EBG pattern. Here, the conductive material used in this method can be conductive ink containing at least one element selected from Au, Al, Ag, Cu, Ni and Fe. Further, the substrate can be formed of any one selected from paper, a polyvinylchloride (PVC) sheet, a polycarbonate (PC) sheet, a polyethyleneterephthalate (PET) sheet, a glycol-modified polyethyleneterephthalate (PETG) sheet, a sheet made of a mixture of a polyvinylchloride (PVC) resin and an acrylonitrile butadiene styrene (ABS) resin, a sheet made of a mixture of a polycarbonate (PC) resin and a glycol-modified polyethyleneterephthalate (PETG) resin, and polyester synthetic paper.

3-2) Experimental Example 1

Figure 14:
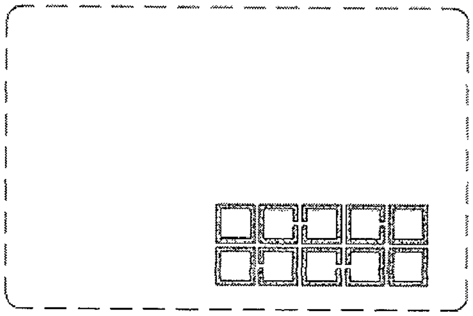

First, a PC sheet having a permittivity of 3.3266 was provided as a printing paper, and then an EBG pattern was printed on the PC sheet using an ink-jet printer (Xenjet 3000), thus forming the EBG pattern shown in FIG. 14. In this case, loop patterns constituting the EBG pattern were formed into square patterns. Each of the square patterns had a side of 3.55 mm, a gap of 0.8 mm and a width of 0.8 mm, and the interval between the square patterns was 0.5 mm. Further, nanocopper-containing ink was used as the conductive ink.

The frequency characteristics of the EBG pattern formed in this way were evaluated. As a result, it was found that the EBG pattern blocked a frequency of 9.07-11.72 GHz in a frequency band of 8-12 GHz.

As described above, the EBG pattern structure according to the present invention can be used to manufacture new security products by applying its frequency characteristics to securities or IDs. Further, the EBG pattern structure of the present invention can be variously used in security technologies for preventing forgery and alteration because various security codes can be created by adjusting the variables of the EBG pattern structure.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

Simple modifications, additions and substitutions belong to the scope of the present invention, and the specific scope of the present invention will be clearly defined by the appended claims.

What is claimed is:

1. An electromagnetic bandgap pattern structure, comprising:

a nonconductive substrate; and a pattern assembly formed on the substrate, wherein the pattern assembly includes regularly arranged closed-loop patterns and open-loop patterns, and the pattern assembly is made of a conductive material.

2. The electromagnetic bandgap pattern structure according to claim 1, wherein the substrate is formed of at least any one selected from paper, a polyvinylchloride sheet, a polycarbonate sheet, a polyethyleneterephthalate sheet, a glycol-modified polyethyleneterephthalate sheet, a sheet made of a mixture of a polyvinylchloride resin and an acrylonitrile butadiene styrene resin, a sheet made of a mixture of a polycarbonate resin and a glycol-modified polyethyleneterephthalate resin, polyester synthetic paper, and a metal thin film.

3. The electromagnetic bandgap pattern structure according to claim 1, wherein the pattern assembly is resonated in a predetermined frequency band, and a value of the predetermined frequency band is determined depending on one of, permittivity of the substrate, line width and length of the closed-loop patterns and the open-loop patterns, intervals between the closed-loop patterns and the open-loop patterns, and gap size of the open-loop patterns.

4. The electromagnetic bandgap pattern structure according to claim 1, wherein each of the closed-loop patterns and the open-loop patterns has a quadrangular shape, each of the open-loop patterns has a gap formed in any one of four directions, and the pattern assembly has one or more resonance frequency bands depending on the direction of the gap formed in each of the quadrangular open-loop patterns.

5. The electromagnetic bandgap pattern structure according to claim 1, wherein the conductive material includes at least one element selected from Au, Al, Ag, Cu, Ni and Fe.

6. The electromagnetic bandgap pattern structure according to claim 1, wherein the pattern assembly further includes bar patterns regularly arranged in combination with one of, the closed-loop patterns and the open-loop patterns.

7. The electromagnetic bandgap pattern structure according to claim 6, wherein the pattern assembly is resonated in a predetermined frequency band, and a value of the predetermined frequency band is determined depending on one of, permittivity of the substrate, line width and length of the closed-loop patterns and the open-loop patterns, intervals between the closed-loop patterns and the open-loop patterns, gap size of the open-loop patterns and length of the bar patterns.

8. The electromagnetic bandgap pattern structure according to claim 6, wherein the conductive material includes at least one element selected from Au, Al, Ag, Cu, Ni and Fe.

9. A security product using an electromagnetic bandgap pattern structure, the electromagnetic bandgap pattern structure comprising:

a nonconductive substrate; and a pattern assembly formed on the substrate, wherein the pattern assembly includes regularly arranged closed-loop patterns and open-loop patterns, and the pattern assembly is made of a conductive material.

10. The security product according to claim 9, wherein the conductive material includes at least one element selected from Au, Al, Ag, Cu, Ni and Fe.

11. The security product according to claim 9, wherein the substrate is formed of at least any one selected from paper, a polyvinylchloride sheet, a polycarbonate sheet, a polyethyleneterephthalate sheet, a glycol-modified polyethyleneterephthalate sheet, a sheet made of a mixture of a polyvinylchloride resin and an acrylonitrile butadiene styrene resin, a sheet made of a mixture of a polycarbonate resin and a glycol-modified polyethyleneterephthalate resin, polyester synthetic paper, and a metal thin film.

12. The security product according to claim 9, wherein the pattern assembly is resonated in a predetermined frequency band, and a value of the predetermined frequency band is determined depending on one of, permittivity of the substrate, line width and length of the closed-loop patterns and the open-loop patterns, intervals between the closed-loop patterns and the open-loop patterns, and gap size of the open-loop patterns.

13. The security product according to claim 9, wherein each of the closed-loop patterns and the open-loop patterns has a quadrangular shape, each of the open-loop patterns has a gap formed in any one of four directions, and the pattern assembly has one or more resonance frequency bands depending on the direction of the gap formed in each of the quadrangular open-loop patterns.

14. The security product according to claim 9, wherein the pattern assembly further includes bar patterns regularly arranged in combination with one of, the closed-loop patterns and the open-loop patterns.

15. The security product according to claim 14, wherein the pattern assembly is resonated in a predetermined frequency band, and a value of the predetermined frequency band is determined depending on one of, permittivity of the substrate, line width and length of the closed-loop patterns and the open-loop patterns, intervals between the closed-loop patterns and the open-loop patterns, gap size of the open-loop patterns and length of the bar patterns.

16. An electromagnetic bandgap pattern structure, comprising:

a nonconductive substrate;

a pattern assembly formed on the substrate;

wherein, the pattern assembly including regularly arranged closed-loop patterns, open-loop patterns, and bar patterns;

the pattern assembly being made of a conductive material;

the conductive material including at least one element selected from Au, Al, Ag, Cu, Ni and Fe;

the substrate being formed of at least any one selected from paper, a polyvinylchloride sheet, a polycarbonate sheet, a polyethyleneterephthalate sheet, a glycol-modified polyethyleneterephthalate sheet, a sheet made of a mixture of a polyvinylchloride resin and an acrylonitrile butadiene styrene resin, a sheet made of a mixture of a polycarbonate resin and a glycol-modified polyethyleneterephthalate resin, polyester synthetic paper, and a metal thin film;

the pattern assembly being resonated in a predetermined frequency band, and a value of the predetermined frequency band being determined depending on one of, permittivity of the substrate, line width and length of the closed-loop patterns and the open-loop patterns, intervals between the closed-loop patterns and the open-loop patterns, and gap size of the open-loop patterns; and each of the closed-loop patterns and the open-loop patterns having a quadrangular shape, each of the open-loop patterns having a gap formed in any one of four directions, and the pattern assembly having one or more resonance frequency bands depending on the direction of the gap formed in each of the quadrangular open-loop patterns.

17. A security product using an electromagnetic bandgap pattern structure, the electromagnetic bandgap pattern structure comprising:

a nonconductive substrate; and a pattern assembly formed on the substrate;

wherein, the pattern assembly including regularly arranged closed-loop patterns, open-loop patterns, and bar patterns;

the pattern assembly being made of a conductive material;

the conductive material including at least one element selected from Au, Al, Ag, Cu, Ni and Fe;

the substrate being formed of at least any one selected from paper, a polyvinylchloride sheet, a polycarbonate sheet, a polyethyleneterephthalate sheet, a glycol-modified polyethyleneterephthalate sheet, a sheet made of a mixture of a polyvinylchloride resin and an acrylonitrile butadiene styrene resin, a sheet made of a mixture of a polycarbonate resin and a glycol-modified polyethyleneterephthalate resin, polyester synthetic paper, and a metal thin film;

the pattern assembly being resonated in a predetermined frequency band, and a value of the predetermined frequency band being determined depending on one of, permittivity of the substrate, line width and length of the closed-loop patterns and the open-loop patterns, intervals between the closed-loop patterns and the open-loop patterns, and gap size of the open-loop patterns; and each of the closed-loop patterns and the open-loop patterns having a quadrangular shape, each of the open-loop patterns having a gap formed in any one of four directions, and the pattern assembly having one or more resonance frequency bands depending on the direction of the gap formed in each of the quadrangular open-loop patterns.

* * * * *